United States Patent
Mader et al.

(10) Patent No.: US 7,109,804 B2
(45) Date of Patent: Sep. 19, 2006

(54) PRECISION RELAXATION OSCILLATOR WITHOUT COMPARATOR DELAY ERRORS

(75) Inventors: Urs H. Mader, Cupertino, CA (US); Yvonne Ko, San Jose, CA (US); Franco Cocetta, Premariacco (IT); Jeff Kotowski, Nevada City, CA (US); Xiaoying Yu, Saratoga, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 138 days.

(21) Appl. No.: 10/834,326

(22) Filed: Apr. 27, 2004

(65) Prior Publication Data

US 2005/0237118 A1    Oct. 27, 2005

(51) Int. Cl.
*H03L 7/00* (2006.01)
*H03B 5/10* (2006.01)

(52) U.S. Cl. ............... 331/16; 331/111; 331/113 R; 331/143; 331/176; 331/66; 331/177 R; 327/157

(58) Field of Classification Search ............... 331/16, 331/143, 113 R, 111, 176, 66, 177 R; 327/157
See application file for complete search history.

(56) References Cited

U.S. PATENT DOCUMENTS

| 5,202,647 A | * | 4/1993 | Muraki et al. ............... 331/74 |
| 6,169,428 B1 | | 1/2001 | Mader |
| 6,342,817 B1 | * | 1/2002 | Crofts et al. ............... 331/1 R |
| 2003/0179318 A1 | * | 9/2003 | Alkhalili et al. ............ 348/537 |

* cited by examiner

*Primary Examiner*—Michael B Shingleton
(74) *Attorney, Agent, or Firm*—Jenkens & Gilchrist, P.C.

(57) ABSTRACT

A relaxation oscillator for generating an oscillator output signal having a predetermined frequency. The relaxation oscillator includes an interleaved charge pump for providing a restoring charge to an integrator in response to at least one charge pump control signal. The relaxation oscillator further includes an integrator having an integrator input connected to the current summing node. The integrator is adapted to produce an integrator output signal having the predetermined frequency at an integrator output. A comparator having an input connected to the integrator output is adapted to generate the oscillator output signal having the predetermined frequency in response to the integrator output signal.

44 Claims, 7 Drawing Sheets

PRECISION RELAXATION OSCILLATOR WITHOUT COMPARATOR DELAY ERRORS

TECHNICAL FIELD OF THE INVENTION

The present invention relates to an improved oscillator circuit, and in particular to an improved relaxation oscillator without comparator delay errors.

BACKGROUND OF THE INVENTION

A variety of methods are known for creating oscillator circuits for providing periodic signals of a desired frequency. A large class of oscillator configurations that exist in monolithic integrated circuit design are those known as relaxation oscillators or multivibrators. Conventional relaxation oscillators operate by alternately charging and discharging a timing capacitor between two internally set threshold voltage levels. This results in the generation of a periodic output signal waveform whose frequency is inversely proportional to the value of the timing capacitor. Conventional relaxation oscillator configurations include R-C charge and discharge oscillators, constant-current charge and discharge oscillators, and emitter-coupled multivibrators.

However, conventional relaxation oscillators suffer from a number of limitations that affect both their implementation and the quality of the resulting periodic output signal waveform. For example, in conventional relaxation oscillators comparator delay contributes significantly to the oscillator period of the relaxation oscillator. In order to increase precision, the comparator must be made to operate very quickly. This usually has the side effect of increased supply current requirements and compromised accuracy at high speeds of operation. Thus there is a need for a precision relaxation oscillator having improved implementation properties, as well as an improved periodic output signal waveform.

SUMMARY OF THE INVENTION

One embodiment of the present invention is directed to an oscillator for generating an oscillator output signal having a predetermined frequency. The oscillator includes a summing node having a first connection to an output of a voltage to current converter, a second connection to an output of a charge pump, and a third connection to an input of an integrator.

The oscillator further includes a feedback loop comprised of the integrator, a comparator, and the charge pump, the integrator having an output connected to an input of the comparator, an output of the comparator being connected to an input of the charge pump, and the input of the charge pump initiating a charge pump cycle when the output of the comparator indicates that the output of the integrator has crossed a voltage threshold. The feedback loop is implemented such that a current entering the summing node from the voltage to current converter is substantially equal to and opposite in polarity to a current entering the summing node from the charge pump.

The charge pump includes a voltage input whose voltage is proportional to a voltage connected to a voltage input of the voltage to current converter. The output of the comparator is adapted to provide an oscillator output signal.

Another embodiment of the present invention is directed to a relaxation oscillator for generating an oscillator output signal having a predetermined frequency. In this embodiment, the relaxation oscillator includes a first resistance having a first resistance input adapted to receive a first voltage level, and a first resistance output for producing a second voltage level. The relaxation oscillator further includes a current generator having a current generator input connected to the first resistance output. The current generator is adapted to generate a first current in proportion to a current in the first resistance, and output the first current to a current summing node.

The relaxation oscillator further includes an interleaved charge pump having an input connected to the first voltage level and an output connected to the current summing node. The interleaved charge pump is adapted to provide a restoring charge to the current summing node in response to at least one charge pump control signal.

The relaxation oscillator further includes an integrator having an integrator input connected to the current summing node. The integrator is adapted to produce an integrator output signal having the predetermined frequency at an integrator output. The predetermined frequency is determined from a capacitance value associated with the interleaved charge pump and a resistance value associated with the first resistance. A comparator having an input connected to the integrator output is adapted to generate the oscillator output signal having the predetermined frequency in response to the integrator output signal.

Another embodiment of the present invention is directed to an oscillator for generating an oscillator output signal having a predetermined frequency, the oscillator including a voltage to current converter having a converter input connected to a supply voltage and a converter output connected to a summing node, the voltage to current converter adapted to generate a current from the supply voltage and output the current to the summing node.

The oscillator further includes an integrator having an integrator input connected to the summing node, the integrator adapted to receive the current from the summing node and produce an integrator output signal at an integrator output, and a comparator having a comparator input connected to the integrator output, the comparator adapted to provide a comparator output signal and an oscillator output signal having a predetermined frequency in response to the integrator output signal.

The oscillator still further includes a charge pump having a control input for receiving a control signal indicative of when the comparator output signal indicates that the integrator output signal has crossed a voltage threshold, a voltage input for receiving a voltage proportional to the supply voltage, and an charge pump output connected to the summing node, the charge pump adapted to provide a charge pump current to the summing node in response to the control signal. The integrator and the comparator comprise a feedback control loop such that the current entering the summing node from the voltage to current converter is substantially equal to and opposite in polarity to the current entering the summing node from the charge pump.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE INVENTION

Figure 1:
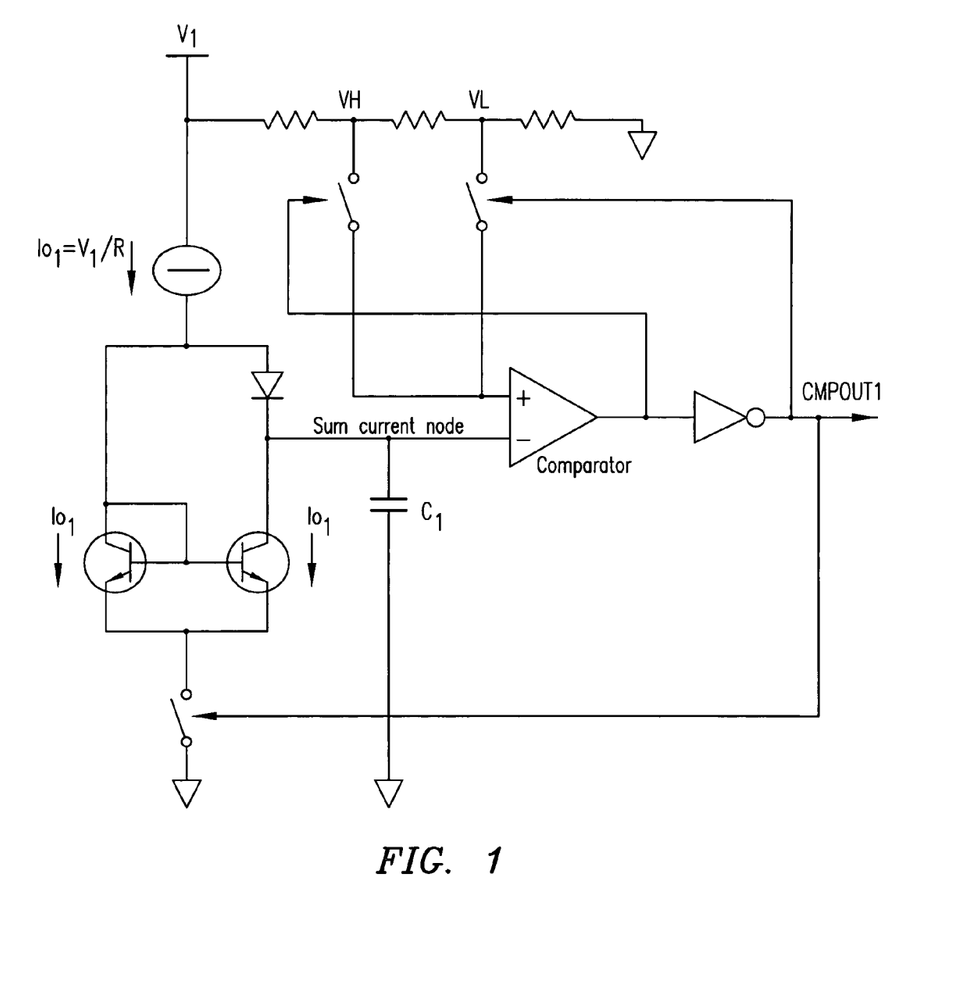
FIG. 1 illustrates a conventional relaxation oscillator.

Reference is now made to the Drawings wherein like reference characters denote like or similar parts throughout the various Figures. Referring now to FIG. 1, a conventional relaxation oscillator is illustrated. The conventional relaxation oscillator illustrated in FIG. 1 is comprised primarily of voltage to current generation circuitry producing a current $Io_1$ from an input voltage $V_1$ that is supplied to a sum current node, a timing capacitor $C_1$ connected between the sum current node and ground, a comparator having an input connected to the sum current node, and an inverter connected to an output of the comparator.

The conventional relaxation oscillator operates by alternately charging and discharging the timing capacitor C, between two internally set switching threshold voltage levels VH and VL to generate a period waveform as an input into the comparator. This results in the generation of a periodic output signal waveform CMPOUT1 whose frequency is inversely proportional to the value of the timing capacitor $C_1$. The periodic output signal waveform CMPOUT1 is further provided to a number of switches whose function is to control the alternate charging and discharging of the timing capacitor $C_1$ in accordance with CMPOUT1.

The conventional relaxation oscillator of FIG. 1 suffers from several limitations which can possibly negatively effect the operation of the oscillator. These can include negative effects caused by the switching delay of the comparator, the variation in delay of the comparator due to temperature, instability of the switching voltage thresholds VH and VL, comparator input bias and diode junction leakage currents, parasitic capacitances associated with the sum current node and their temperature coefficients. In order to try to overcome at least some of the limitations of the conventional relaxation oscillator as illustrated in FIG. 1, another class of relaxation oscillators known as stray insensitive oscillators has been developed.

Figure 2:
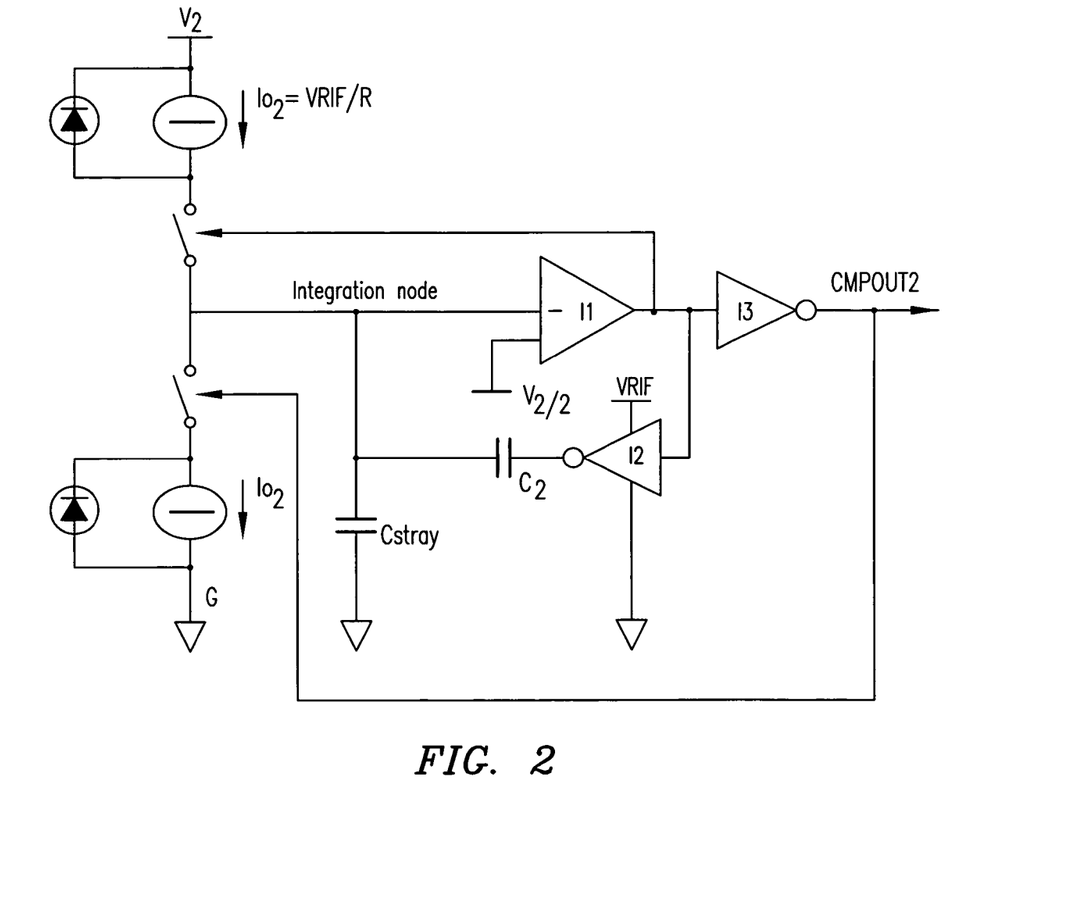
FIG. 2 illustrates a conventional stray insensitive oscillator.

Referring now to FIG. 2, a conventional stray insensitive oscillator is illustrated. The conventional stray insensitive oscillator illustrated in FIG. 2 includes a high side current generator and a low side current generator, each generating a current $Io_2$ from an input voltage $V_2$ for supply to an integration node. The conventional stray insensitive oscillator further includes a comparator I1 having a negative input connected to the integration node and a positive input connected to a voltage of $V_2/2$, an inverter I2 having an input connected to an output of the comparator I1, a timing capacitor $C_2$ connected between an output of the inverter I2 and the integration node, and an inverter I3 connected to the output of the comparator I1. The inverter I2 further has supply inputs connected to a supply voltage VRIF and a ground. In the stray insensitive oscillator of FIG. 2, current-voltage conversion is performed by the high side current generator and a low side current generator.

The stray insensitive oscillator of FIG. 2 operates by alternately charging and discharging the timing capacitor $C_2$ to generate a period waveform as an input into the comparator I1. The output of the comparator I1 is provided to the inverter I3 to produce a periodic output signal waveform CMPOUT2 whose frequency is inversely proportional to the value of the timing capacitor $C_2$. The periodic output signal waveform CMPOUT2 is further provided to a number of switches whose function is to control the alternate charging and discharging of the timing capacitor $C_2$ in accordance with CMPOUT2.

Although the stray insensitive oscillator of FIG. 2 improves upon some of the problems of the conventional relaxation oscillator of FIG. 1, such as those arising from the stability of the switching threshold voltages and parasitic capacitances associated the sum current node, a number of problems still exist and at least one other shortcoming has been identified. For example, the stray insensitive oscillator of FIG. 2 still suffers from comparator delays. In addition, a major drawback of the stray insensitive oscillator of FIG. 2 arises from the necessity of having two precise and matched current generators, i.e., the high side current generator and the low side current generator.

Figure 3:
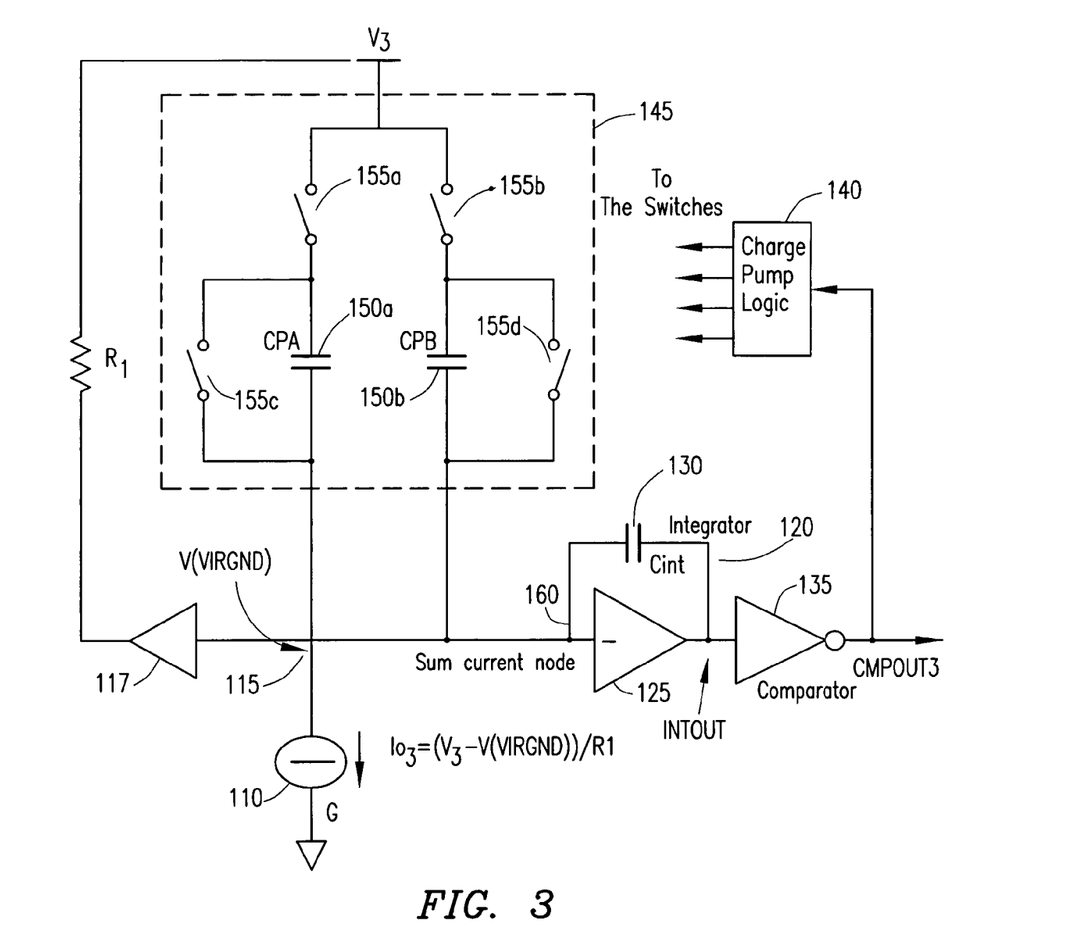
FIG. 3 illustrates a block diagram of a precision relaxation oscillator in accordance with an embodiment of the present invention.

Referring now to FIG. 3, a block diagram of a precision relaxation oscillator in accordance with an embodiment of the present invention is illustrated. An input of a voltage to current convertor 110 is connected to a supply voltage $V_3$, and an output of the voltage to current convertor 110 is connected to a ground node G. The voltage to current converter 110 generates a current 103 having a value that is determined by the following equation:

$$Io_3 = (V_3 - V_{VIRGRND})/R1 \qquad \text{(Equation 1)}$$

where $V_{VIRGRND}$ is representative of the voltage of a virtual ground node 115 at the input of the voltage to current convertor 110, and R1 is representative of a resistance connected between the supply voltage source $V_3$ and the voltage to current convertor 110 through a buffer 117. Accordingly, the voltage to current converter 110 generates a current that is proportional to the current in the resistance R1. The virtual ground node 115 is further connected to an input of an integrator 120. As a result, a current proportional to current 103 is supplied to the integrator 120 from the virtual ground node 115. The integrator 120 may be comprised of an amplifier 125 and an integration capacitor 130 having a capacitance Cint connected between an input and output of the amplifier 125. The integrator 120 functions to perform an integration upon the signal at its input to provide an output INTOUT. The output INTOUT of the integrator 120 is connected to an input of a comparator 135 to produce a comparator output CMPOUT3.

The comparator output CMPOUT3 is provided to charge pump logic 140, which generates control signals that are provided to an interleaved charge pump 145 in response to the comparator output CMPOUT3. This interleaved charge pump 145 is comprised of a first charge pump capacitor 150a having a capacitance CPA and a second charge pump capacitor 150b having a capacitance CPB. The first charge pump capacitor 150a and the second charge pump capacitor 150b are each selectively connectable between the supply voltage $V_3$ and the virtual ground node 115 through the use of charger switches 155c, 155d, and discharger switches 155a, 155b. Charger switches 155c, 155d, and discharger switches 155a, 155b are configured to open and close in accordance with the control signals from the charge pump logic 140 such that each of the first charge pump capacitor 150a and the second charge pump capacitor 150b are alternately charged by the supply voltage $V_3$ into the virtual ground node 115 of the integrator 120, and discharged to zero Volts.

For example, while the first charge pump capacitor 150a is being charged by the supply voltage $V_3$, and therefore forcing charge into the virtual ground node, the second charge pump capacitor 150b is discharging to zero Volts. Alternately, while the first charge pump capacitor 150a is discharging to zero volts, the second charge pump capacitor 150b is being charged by the supply voltage $V_3$ and sending a unit of charge into the integrator 120.

During operation of the precision relaxation oscillator of FIG. 3, the components of the precision relaxation oscillator operate as a voltage to frequency convertor loop to generate an output frequency $F_{OUT}$ at the output CMPOUT3 of the comparator 135. The output frequency $F_{OUT}$ is determined by the following equation:

$$F_{OUT} = \frac{1}{R1 * CPx} \quad \text{(Equation 2)}$$

where the value of CPx is determined alternately by the first charge pump capacitor 150a capacitance CPA, and the second charge pump capacitor 150b capacitance CPB, in accordance with the particular charge pump capacitor that is currently in the discharging stage. Preferably, the values of capacitance CPA and capacitance CPB are chosen to be equal in order to make the oscillation periods due to each capacitance equal.

The interleaved charge pump 145 further functions to restore charge to the integrator 120 of the voltage to frequency convertor loop at a charge summing node 160. The voltage variation on the output INTOUT of the integrator 120 can thus be controlled by the interleaved charge pump 145. The interleaved charge pump 145 of the present invention provides for an improved method of integrator charge restoration over that of conventional methods. The use of a pair of alternately charging and discharging capacitors in the interleaved charge pump 145 allows for precise control of the charge delivered to the integrator 120, as well as allowing for longer settling times for each capacitor to charge and discharge. Because the oscillation period of the present invention is dependent upon the values of R1 and CPA or CPB independent of comparator delay, comparator delay errors are eliminated.

The output INTOUT of the integrator 120, which ideally takes the form of a sawtooth wave, is then passed to the input of the comparator 135. The comparator 135 ideally maintains a constant low voltage value at its output CMPOUT3 until the integrator output INTOUT exceeds an upper threshold value of the comparator 135. When the integrator output INTOUT crosses the upper threshold value, the output CMPOUT3 of comparator 135 ideally switches to a high voltage value. When the integrator output INTOUT crosses below a lower threshold value of the comparator 135, the output CMPOUT3 of the comparator 135 ideally switches to a low voltage value. As a result, the sawtooth wave of INTOUT provided by the integrator 120 is converted by the comparator 135 to a rectangular wave CMPOUT3 having a frequency of $F_{OUT}$.

The output CMPOUT3 is further provided to the charge pump logic 140. The charge pump logic 140 then generates the control signals for the interleaved charge pump 145 in order to synchronize the alternate charging and discharging of the first charge pump capacitor 150a and the second charge pump capacitor 150b with the frequency $F_{OUT}$. In one embodiment of the present invention the charge pump logic 140 may be comprised a D flip-flop, which divides the output CMPOUT3 of the comparator 135 by two to generate charge and discharge drive signals having a frequency one-half that of $F_{OUT}$.

Thus, the integrator 120, the comparator 135, charge pump logic 140, and interleaved charge pump 145 function as a feedback loop. The charge pump logic 140 initiates a charge pump cycle whenever the output of the comparator 135 indicates that the output of the integrator 120 has crossed a threshold value. As a result, the feedback loop functions such that the current entering the charge summing node 160 from the voltage to current converter is equal to and opposite in polarity to the current entering the charge summing node 160 from the interleaved charge pump 145.

Figure 4:
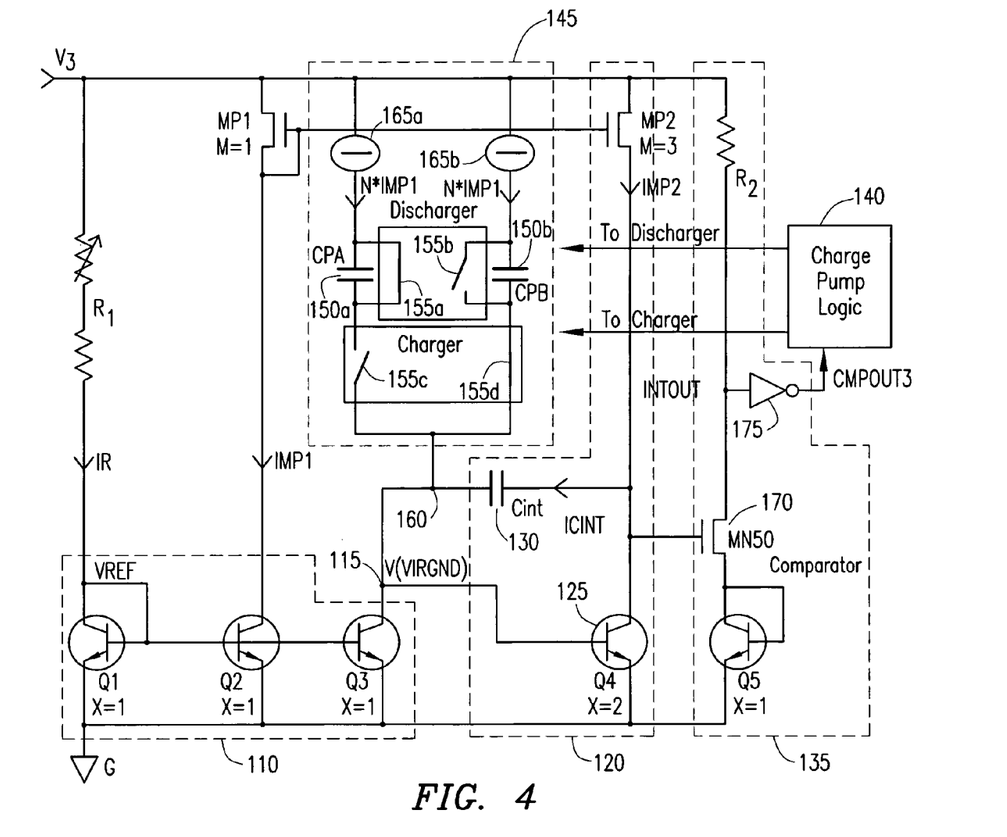
FIG. 4 illustrates a circuit diagram of a precision relaxation oscillator in accordance with the embodiment of FIG. 3.

Referring now to FIG. 4, a circuit diagram of a precision relaxation oscillator in accordance with the embodiment of FIG. 3 is illustrated. A voltage to current converter 110 is shown comprising an NPN BJT transistor Q1 having a collector connected to a supply voltage $V_3$ through a voltage supply line having a resistance R1, and an emitter connected to a ground node G. The collector of transistor Q1 is further connected to a base of the transistor Q1 with a line having a voltage of VREF. The voltage to current convertor further comprises a current mirror having a high side current mirror NPN BJT transistor Q2 and a low side current mirror NPN BJT transistor Q3. The base of transistor Q2 is connected to the VREF line, and the collector of transistor Q3 is connected to a virtual ground node 115 having a voltage $V_{VIRGRND}$. The base of transistor Q3 is connected to the VREF line.

The virtual ground node 115 is further connected to an input of an integrator 120. The integrator 120 is comprised of an NPN BJT transistor Q4 functioning as an amplifier 125 and an integration capacitor 130 having a capacitance Cint connected between the base and collector of the transistor Q4. The output INTOUT of the integrator 120 is connected to an input of a comparator 135 comprised of a N-channel type MOS transistor (MN50) 170 and an NPN BJT transistor Q5 configured as a diode. The emitters of transistors Q2, Q3, Q4, and Q5 are connected to the ground node G. The comparator 135 further includes an inverter 175 that functions to invert the output of the comparator 135. The comparator 135 produces an output CMPOUT3 that is provided to charge pump logic 140, which generates a charge control signal (To Charger) and a discharge control signal (To Discharger) that are provided to an interleaved charge pump 145 in response to the comparator output CMPOUT3.

The interleaved charge pump 145 is comprised of a first charge pump capacitor 150a having a capacitance CPA and a second charge pump capacitor 150b having a capacitance CPB. The interleaved charge pump 145 further comprises a current generator 165a providing charge current to the first charge pump capacitor 150a, and a current generator 165b providing charge current to the second charge pump capacitor 150b. The integrator 120 further includes a P-channel MOS transistor MP1 connected between the voltage $V_3$ and the collector of transistor Q2 through a line having a current IMP1, and a P-channel MOS transistor MP2 connected between the voltage $V_3$ and the collector of transistor Q4 through a line having a current IMP2. In addition, the gates of transistor MP1 and transistor MP2 are connected together, and further connected to the drain of transistor MP1 as well as the collector of transistor Q2. Accordingly, transistor MP1 and transistor MP2 serve to bias the collector of transistor Q4.

Current generator 165a and current generator 165b are each adapted to supply a current of N*IMP1 to first charge pump capacitor 150a and second charge pump capacitor 150b, respectively. The value of N is chosen as a compromise between the charge settling error on the first charge pump capacitor 150a and the second charge pump capacitor 150b, and the variation of β due to the current density of transistor Q4. The current generators 165a and 165b automatically act as resistors to $V_3$ when the voltage across the source is less than approximately 200 mV. The transition to resistor will decrease the charge current to zero as voltage on the N*IMP1 node approaches $V_3$. Accordingly, the current generators 165a and 165b act as PMOS current mirrors having the same current as in the MP1 and transistor MP2 mirror transistors, the value of N in N*IMP1 referring to the relative maximum output current of the current generators 165a and 165b to the current of transistor MP1.

The first charge pump capacitor 150a and the second charge pump capacitor 150b are each selectively connectable between the supply voltage $V_3$ and the virtual ground node 115 through the use of discharger switches 155a, 155b, and charger switches 155c, 155d. Discharger switches 155a, 155b, and charger switches 155c, 155d are configured to open and close in accordance with the control signals (TO_CHARGER, TO_DISCHARGER) from the charge pump logic 140 such that each of the first charge pump capacitor 150a and the second charge pump capacitor 150b are alternately charged by the supply voltage $V_3$, through the virtual ground node 115 of the integrator 120, and discharged locally by shorting terminals of the first charge pump capacitor 150a and the second charge pump capacitor 150b. For example, while the first charge pump capacitor 150a is being discharged locally by discharge switch 155a, the second charge pump capacitor 150b is charging by connecting charge switch 155d to supply voltage $V_3$ and the virtual ground node 115. Alternately, while the first charge pump capacitor 150a is charging to $V_3$ and the virtual ground 115 by connecting charge switch 155c, the second charge pump capacitor 150b is being discharged by the discharge switch 155b.

During operation of the precision relaxation oscillator of FIG. 4, the components of the precision relaxation oscillator operate as a voltage to frequency convertor loop to generate an output frequency $F_{OUT}$ at the output CMPOUT3 of the comparator 135. The output frequency $F_{OUT}$ is determined by the following equation:

$$F_{OUT} = \frac{1}{R1*CPx} \quad \text{(Equation 3)}$$

where the value of CPx is determined alternately by the first charge pump capacitor 150a capacitance CPA, and the second charge pump capacitor 150b capacitance CPB, in accordance with the particular charge pump capacitor that is currently in the discharging stage. Preferably, the values of capacitance CPA and capacitance CPB are chosen to be equal in order to make the oscillation periods due to each capacitance equal.

The interleaved charge pump 145 further functions to restore charge to the integrator 120 of the voltage to frequency convertor loop at a charge summing node 160. The voltage variation on the output INTOUT of the integrator 120 can thus be controlled by the interleaved charge pump 145.

The output INTOUT of the integrator 120 is then passed to the input of the comparator 135. An example waveform INTOUT is illustrated in FIG. 5A. The comparator 135 maintains a constant low voltage value at its output CMPOUT3 until the integrator output INTOUT exceeds a threshold value of the comparator 135. When the integrator output INTOUT crosses the threshold value, the output CMPOUT3 of comparator 135 switches to a high voltage value. When the integrator output INTOUT crosses below the threshold value of the comparator 135, the output CMPOUT3 of the comparator 135 switches to a low voltage value. As a result, the signal waveform of INTOUT provided by the integrator 120 is converted by the comparator 135 to a rectangular wave CMPOUT3 having a frequency of $F_{OUT}$. An example of an internal waveform of the comparator at the drain node output of MN50 is illustrated in FIG. 5B.

Figure 5:
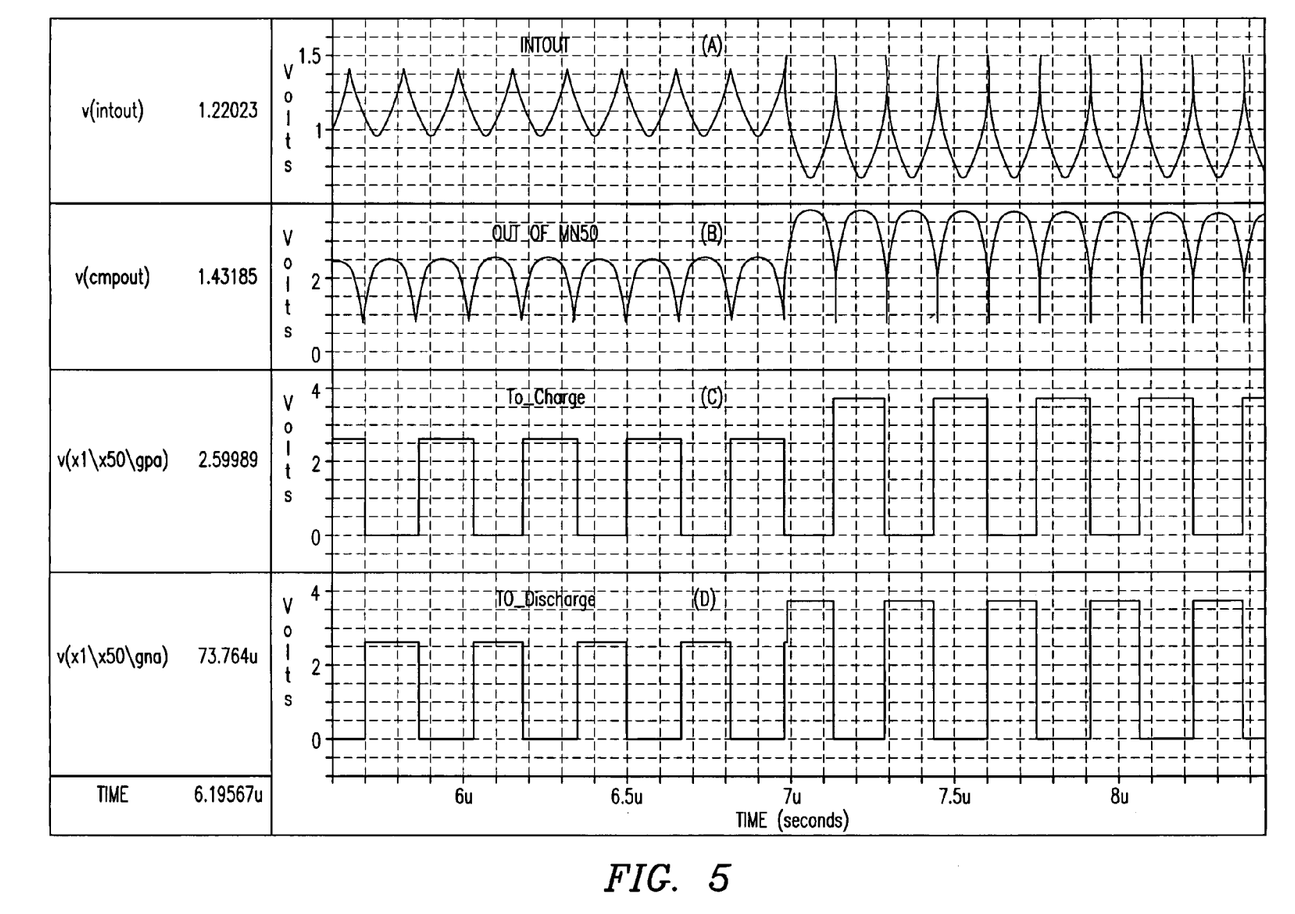
FIG. 5 illustrates example signal waveforms of the precision relaxation oscillator of FIG. 4.

The output CMPOUT3 is further provided to the charge pump logic 140. The charge pump logic 140 then generates the control signals (TO_CHARGE, TO_DISCHARGE) for the interleaved charge pump 145 in order to synchronize the alternate charging and discharging of the first charge pump capacitor 150a and the second charge pump capacitor 150b with the frequency FOUT. An example waveform of the TO_CHARGE control signal is illustrated in FIG. 5C, and an example waveform of the TO_DISCHARGE control signal is illustrated in FIG. 5D. In the example of FIG. 5, it can be seen that the TO_CHARGE and TO_DISCHARGE control signals have a duty cycle that is one-half that of the frequency of FOUT. Such a duty cycle can be obtained through the use of a D flip-flop as the charge pump logic 140.

The structure of the precision relaxation oscillator of FIG. 4 allows for compensation of the difference between current IR between $V_3$ and the collector of transistor Q1 and the current $I_{CINT}$ in the integration capacitor 130 due to the finite value of β for all the NPN BJT transistors in the low side current mirror. Assuming that the base currents for transistor Q1, transistor Q2, and transistor Q3 are equal, the current $I_{CINT}$ can be calculated by the following equation:

$$I_{CINT}=IR-3*Ib(Q1)+Ib(Q4) \quad \text{(EQUATION 4)}$$

where Ib(Q1) is representative of the base current for transistor Q1, and Ib(Q4) is representative of the base current for transistor Q4.

Thus, in order to recover the three base currents for transistor Q1, transistor Q2, and transistor Q3, transistor Q4 should be biased at a collector current three times that of the collector current of transistor Q1. The average current into the integration capacitor 130 over an oscillation period should sum to zero. By integration of Equation 4 over an oscillation period, it can be shown that perfect compensation of base current can be obtained with a ratio of the drain area of MP2 to the drain area of MP1 equal to 3.

The current generators 165a and 165b, each producing a current of N*IMP1, are used to control the current density in transistor Q4 during the charging phase. However, the current from the current generators 165a and 165b does not significantly affect the output frequency of the oscillator. In fact, the average value of the current generators 165a and 165b during an oscillation period is equal to that of the current IR. The current generators 165a and 165b serve to limit the maximum current in the collector of transistor Q4. In this way, the β of transistor Q4 does not change significantly over the operating cycle, making the oscillator more precise. In the present invention, a value of N=4 has been found to produce a good compromise between the charge settling error on the first charge pump capacitor 150a and the second charge pump capacitor 150b, and the variation of β due to the current density of transistor Q4.

In order to provide the best voltage matching between voltage VREF and $V_{VIRGRND}$, the emitter area of transistor Q4 was chosen equal to two times the emitter area of transistor Q1. This is due to the fact that at the end of a switching period, the current on transistor Q4 is two times that of the current on transistor Q1.

The voltage swing $\Delta V_{CINT}$ on the integration capacitor 130 can be found by the following equation:

$$\Delta V_{CINT} = \frac{CPx}{C_{INT}} * \left(\frac{N-1}{N}\right) * (V_3 - V_{REF}) \qquad \text{(Equation 5)}$$

where the value of CPx is determined alternately by the first charge pump capacitor 150a capacitance CPA, and the second charge pump capacitor 150b capacitance CPB.

As the voltage $V_{VIRGRND}$ on the integration capacitor 130 is quite stable, the voltage variation on the integrator 120 output $\Delta V_{INTOUT}$ is equal to the voltage variation $\Delta V_{CINT}$ on the integration capacitor 130. Accordingly EQUATION 5 may be used to calculate the headroom conditions on transistor MP2 and transistor Q4. The knowledge of $\Delta V_{INTOUT}$ is useful in choosing the design of the comparator 135. In the precision relaxation oscillator of FIG. 4, the N-channel type MOS transistor 170, a resistive load R2, and the NPN BJT transistor Q5 were found to provide good headroom for the comparator 135. In addition, the N-channel type MOS transistor 170 was chosen to provide good rejection of spike voltages on the supply line $V_3$. Transistor Q5 is used to avoid a saturation condition for transistor Q4.

Figure 6:
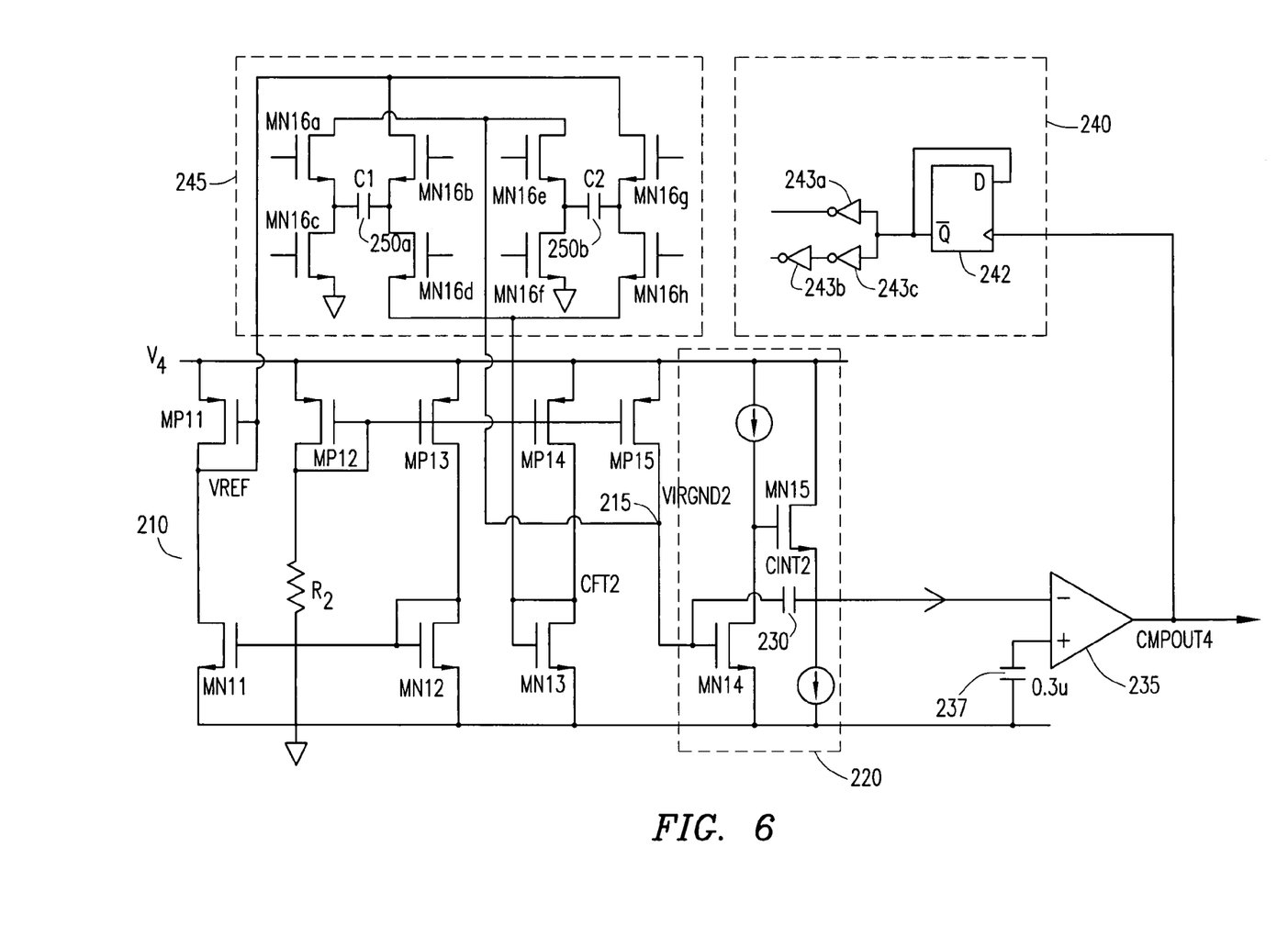
FIG. 6 illustrates a circuit diagram of a precision relaxation oscillator in accordance with another embodiment of the present invention.

Referring now to FIG. 6, a circuit diagram of a precision relaxation oscillator in accordance with another embodiment of the present invention is illustrated. In contrast to the embodiment of FIG. 4, FIG. 6 illustrates an embodiment of the present invention implemented using only metal oxide semiconductor (MOS) transistors. In contrast to the NPN mirror of FIG. 4, the oscillator of FIG. 6 utilizes a PMOS mirror. This allows the embodiment of FIG. 6 to utilize a circuit technique known as MOS chopping for current error cancellation, in contrast to the embodiment of FIG. 4 which uses base current cancellation, to obtain greater accuracy.

In the precision relaxation oscillator of FIG. 6, a voltage to current converter 210 is shown comprising a PMOS transistor MP11 having a source and gate connected to a supply voltage $V_4$, and a drain connected to the drain of a NMOS transistor MN11. The drain of PMOS transistor MP11 further possesses a voltage VREF. The voltage to current converter 210 further comprises a PMOS transistor MP12 having a source connected to supply voltage $V_4$. The gate and drain of PMOS transistor MP12 is connected to a resistance R2, the resistance R2 being further connected to a ground node.

The gate of PMOS transistor MP12 is further connected to the respective gates of PMOS transistor MP13, PMOS transistor MP14, and PMOS transistor MP15 which form a portion of a MOS chopping circuit. The sources of PMOS transistor MP13, PMOS transistor MP14, and PMOS transistor MP15 are each respectively connected to the supply voltage $V_4$. The gate of NMOS transistor MN11 is further connected to the gate and drain of a NMOS transistor MN12. The drain of NMOS transistor MN12 is further connected to the drain of PMOS transistor MP13. The drain of the PMOS transistor MP14 is connected to the drain and gate of an NMOS transistor MN13. The drains of NMOS transistor MN11, NMOS transistor MN12, and NMOS transistor MN13 are each connected the ground node. The drain of PMOS transistor MP15 is connected to a virtual ground node 215 having a voltage $V_{VIRGND2}$.

The virtual ground node 215 is further connected to an input of an integrator 215. The integrator 215 is comprised of an NMOS transistor MN14 functioning as an amplifier, an integration capacitor 230 having capacitance a $C_{int2}$, and a NMOS transistor MN15. The NMOS transistor MN14 has a gate connected to the virtual ground node 215, a drain connected to the supply voltage $V_4$, and a source connected to the ground node. The NMOS transistor MN15 has a gate connected to the drain of NMOS transistor MN14, a drain connected to the supply voltage $V_4$, and a source connected to the ground node. The integration capacitor 230 is connected between the gate of NMOS transistor MN14 and the source of NMOS transistor MN15. The output of the integrator 220 is produced at the source of NMOS transistor MN15.

The output of the integrator 220 is connected to the negative input of a comparator 235. A positive input of the comparator 235 is connected to a positive terminal of a voltage source 237, a negative terminal of the voltage source 237 being connected to the ground node. In one embodiment of the present invention the voltage source 237 produces an output having a voltage of of 0.3 v. An output CMPOUT4 of the comparator 235 is then provided to charge pump logic 240.

The charge pump logic 240 generates control signals that are provided to an interleaved charge pump 245 in response to the comparator output CMPOUT4. In the particular embodiment of FIG. 6, the charge pump logic 240 is comprised of a D flip-flop and a plurality of inverters 243a, 243b, and 243c configured to produce alternating charge and discharge control signals. The interleaved charge pump 245 is comprised of a third charge pump capacitor 250a having a capacitance C1, a fourth charge pump capacitor 250b having a capacitance C2, and a plurality of NMOS transistors MN16a–MN16h. The plurality of NMOS transistors MN16a–MN16h are configured to act as switches such that the third charge pump capacitor 250a and fourth charge pump capacitor 250b are selectively connectable between the supply voltage $V_4$ and the virtual ground node 215 in response to the control signals from the charge pump logic 240.

Similarly to the precision relaxation oscillator of FIG. 4, the components of the precision relaxation oscillator of FIG. 6 operate to generate an output frequency $F_{OUT2}$ at the output CMPOUT4 of the comparator 235.

The output frequency $F_{OUT2}$ is determined by the following equation:

$$F_{OUT2} = \frac{1}{R2 * CPy} \qquad \text{(Equation 6)}$$

where the value of CPy is determined alternately by the third charge pump capacitor 250a capacitance C1, and the fourth charge pump capacitor 250b capacitance C2, in accordance with the particular charge pump capacitor that is currently in the discharging stage. Preferably, the values of capacitance CP1 and capacitance CP2 are chosen to be equal in order to make the oscillation periods due to each capacitance equal.

The interleaved charge pump 245 further functions to restore charge to the virtual ground node 215, as well as provide a current error correction value $L_{FIX}$ to the gate and drain of NMOS transistor MN13. As a result, current cancellation is achieved at the virtual ground node 215.

Figure 7:
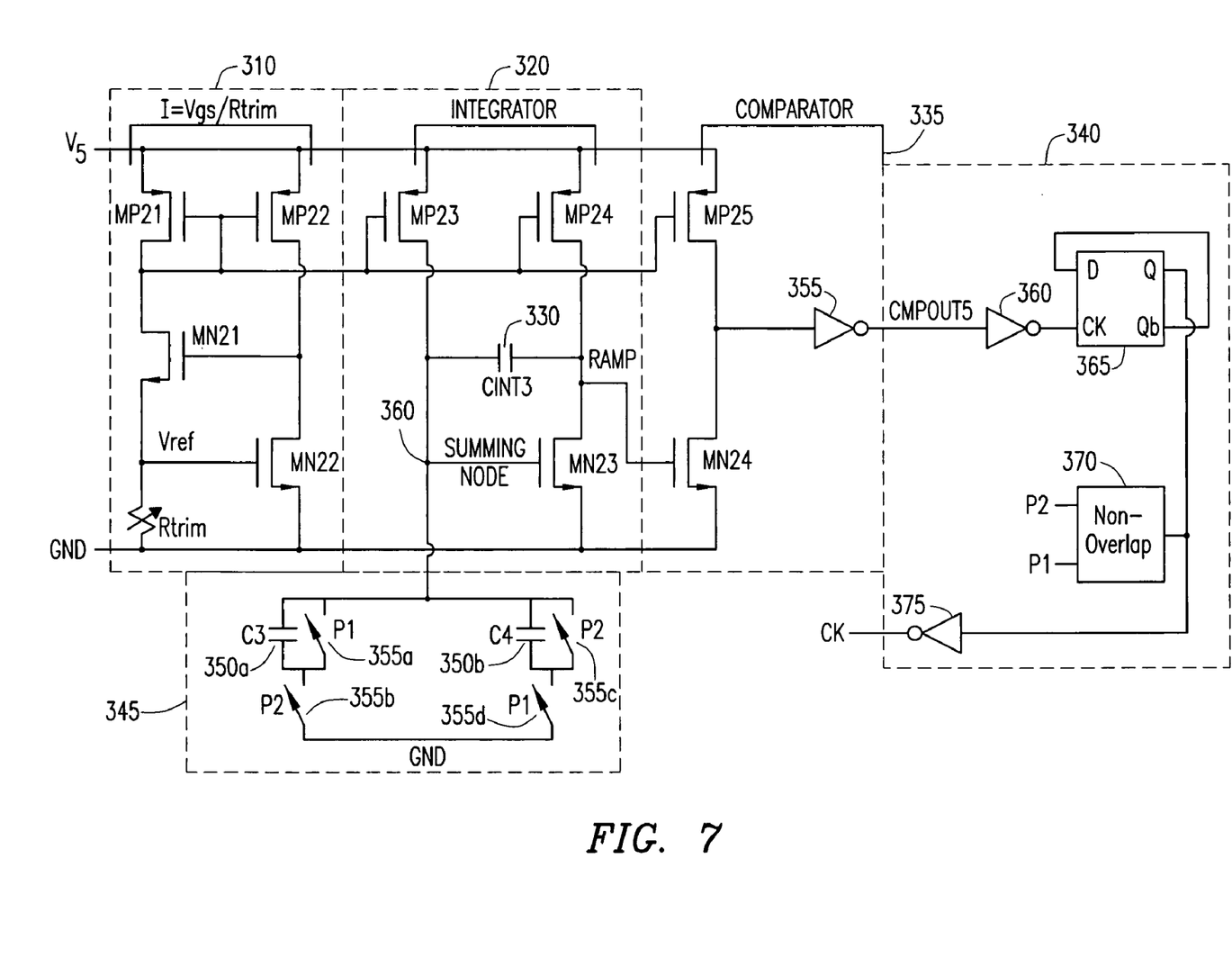
FIG. 7 illustrates a circuit diagram of a precision relaxation oscillator in accordance with still another embodiment of the present invention.

Referring now to FIG. 7, a circuit diagram of a precision relaxation oscillator in accordance with still another embodiment of the present invention is illustrated. Similarly to the embodiment of FIG. 6, FIG. 7 illustrates another embodiment of the present invention that is implemented using only metal oxide semiconductor (MOS) transistors.

In the precision relaxation oscillator of FIG. 7, a voltage to current converter 310 is shown comprising a PMOS transistor MP21, a PMOS transistor MP22, an NMOS transistor MN21, an NMOS transistor MN22, and a resistance $R_{trim}$. The PMOS transistor MP21 has a source connected to a supply voltage Vs, and a drain connected to a drain of NMOS transistor MN21. The gate of PMOS transistor MP21 is further connected to the drain of PMOS transistor MP21 in a diode configuration. The PMOS transistor MP22 has a source connected to supply voltage $V_S$, a gate connected to the gate of PMOS transistor MP21, and a drain connected to a drain of NMOS transistor MN22. A source of NMOS transistor MN21 is connected to the resistance $R_{trim}$, the resistance $R_{trim}$ being further connected to the ground node GND. A gate of NMOS transistor MN22 is connected to the source of NMOS transistor MN21 and the resistance $R_{trim}$ at a node having a voltage Vref.

An output of the voltage to current converter 310 is provided to an input of an integrator 320. The integrator 320 is comprised of an NMOS transistor MN23, an integration capacitor 330 having capacitance a $C_{INT3}$, a PMOS transistor MP23, and a PMOS transistor MP24. The NMOS transistor MN23 and PMOS transistor MP24 form a single gain stage of the integrator 320. The PMOS transistor MP23 has a source connected to the supply voltage $V_S$, a gate connected to the gate of PMOS transistor MP22 (of voltage to current converter 310) and a drain connected to a summing node 360. The PMOS transistor MP24 has a source connected to the supply voltage $V_S$, a gate connected to the gate of PMOS transistor MP23, and a drain connected to a drain of NMOS transistor MN23. The NMOS transistor MN23 has a gate connected to the summing node 360, and a drain connected to the ground node GND. The integration capacitor 330 is connected between the summing node 360 and the drain of NMOS transistor MN23. An output signal of the integrator 320 is produced at the drain of NMOS transistor MN23, the output signal from the integrator 320 having the form of a periodic ramp signal.

The output of the integrator 320 is connected to an input of a comparator 335 that is comprised of a PMOS transistor MP25, an NMOS transistor MN24, and an inverter 355. The PMOS transistor MP25 has a source connected to the supply voltage $V_S$, a gate connected to the gate of PMOS transistor MP24 (of the integrator 320), and a drain connected to a drain of NMOS transistor MN24. The NMOS transistor MN24 further has a gate connected to the output of the integrator 320, and a source connected to the ground node GND. The drain of PMOS transistor MP25 and the drain of NMOS transistor MN24 are further connected to an input of the inverter 355. An output of the inverter produces a comparator output CMPOUT5 that is provided to charge pump logic 340.

The charge pump logic 340 generates control signals, P1 and P2, that are provided to an interleaved charge pump 345 in response to the comparator output CMPOUT5. In the particular embodiment of FIG. 7, the charge pump logic 340 is comprised of an inverter 360, a D flip-flop 365, and a phase generator configured to produce control signals P1 and P2 that are at non-overlapping phases with respect to each other, each of the control signals P1 and P2 indicating alternating charge and discharge cycles. The non-overlapping phases of the control signals P1 and P2 are used to insure that a particular charge pump capacitor is not being provided with a charge and discharge control signal at the same time. For example, the relative phases of control signals P1 and P2 can be at a phase of 180 degrees with respect to each other, such that as one control signal is indicating a charge cycle, the other control signal is indicating a discharge cycle. The charge pump logic further comprises an inverter 375 connected to receive an output from the D flip-flop 365 and produce an oscillator output signal CK.

The interleaved charge pump 345 is comprised of a fifth charge pump capacitor 350a having a capacitance C3, a sixth charge pump capacitor 250b having a capacitance C4, and a plurality of switches 355a–355d. The plurality of switches 355a–355d are configured such that the fifth charge pump capacitor 350a and sixth charge pump capacitor 350b are selectively connectable between the ground node GND and the summing node 360 in response to the control signals P1 and P2 from the charge pump logic 340.

The components of the precision relaxation oscillator of FIG. 7 operate to generate an output frequency $F_{OUT3}$ at the output (CK) of the charge pump logic 340. The output frequency $F_{OUT3}$ is determined by the following equation:

$$F_{OUT3} = \frac{1}{R_{trim} * CPz} \quad \text{(Equation 7)}$$

where the value of CPz is determined alternately by the fifth charge pump capacitor 350a capacitance C3, and the sixth charge pump capacitor 350b capacitance C4, in accordance with the particular charge pump capacitor that is currently in the discharging stage. Preferably, the values of capacitance CP3 and capacitance CP4 are chosen to be equal in order to make the oscillation periods due to each capacitance equal. In one embodiment of the present invention, the value of $R_{trim}$ can be made adjustable in order to achieve a desired output frequency from the precision relaxation oscillator.

The interleaved charge pump 345 further functions to restore charge to the summing node 360 to achieve current cancellation such that the current entering the summing node 360 from the voltage to current converter 310 is equal to and opposite in polarity to the current entering the summing node 360 from the interleaved charge pump 345.

It should be understood that it is desirable to use a startup circuit such as a feedback loop or a dynamic startup circuit to set the components of the oscillator in a predefined state in order to set initial conditions prior to startup, as well as to provide for reliable operation. In an embodiment of the present invention the charge pump expects a rising edge from the comparator before providing a restoring force to the summing node. If the comparator output is stuck high, the integrator will continue to increase its output voltage until it hits the top supply rail, as the current from the voltage to current converter will keep driving the output of the integrator to this supply rail. This will cause the comparator output to stay high in a stable condition and not produce another rising edge to trigger the charge pump. To force the oscillator out of this stable state, a startup circuit can be used.

In one implementation of a startup circuit that can be used in the present invention, a timer with a timeout that is guaranteed to be longer than the oscillation period of the oscillator, can be used. The timer is reset during any time at which the output of the comparator is low. If the timer times out, the integration capacitor is forced to an initial condition below the threshold of the comparator, forcing the output of the comparator low. In another implementation of a startup circuit, a timer can be used such that if the timer times out, a series of pulses is sent to the charge pump to force the output of the integrator back below the comparator threshold.

The precision relaxation oscillator of the present invention provides further advantages, in addition to those previously described, over conventional relaxation oscillators. The precision relaxation oscillator in accordance with an embodiment of the present invention allows for the use of an integrator having a single transistor in its amplifier stage resulting in significant power savings. In addition, the present invention provides for the integration of the components of the oscillator at a transistor level, thereby eliminating the need for explicit gain blocks for the various circuit portions of the oscillator. This transistor level integration leads to improved circuit precision as well as reduced power consumption due to reduced supply current requirements.

It should be understood that the precision relaxation oscillator of the present invention may be used in a wide variety of circuits in which a high accuracy oscillator or an oscillator with reduced supply current is desirable. For example, the precision relaxation oscillator of the present invention may be used in universal asynchronous receiver-transmitter (UART) circuits having integrated time-bases, trimmed time-base circuits, analog to digital convertors, and/or battery pack fuel gauges.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the claims.

For example, although the present invention has been described as using an interleaved charge pump, other charge pump configurations or methods of restoring charge can be used. In addition, it should be understood that other configurations of voltage to current convertors, integrators, and comparators than those described herein can be used without departing from the spirit of the invention.

What is claimed is:

1. A relaxation oscillator for generating an oscillator output signal having a predetermined frequency, the relaxation oscillator comprising:
    a first resistance having a first resistance input adapted to receive a first voltage level and a first resistance output for producing a second voltage level;
    a voltage to current convertor having a voltage to current convertor input connected to the first resistance output, the voltage to current convertor adapted to generate a first current in proportion to the second voltage level, and output the first current to a current summing node;
    a charge pump having an input connected to the first voltage level received at the first resistance and an output connected to the current summing node, the charge pump adapted to provide a restoring charge to the current summing node in response to at least one charge pump control signal, the charge pump comprising an interleaved charge pump having a first charge pump capacitor, and a second charge pump capacitor, each of the first charge pump capacitor and the second charge pump capacitor adapted to be selectively charged by the first voltage level and discharged into the current summing node in response to the at least one charge pump control signal;
    an integrator having an integrator input connected to the current summing node, the integrator adapted to produce an integrator output signal having the predetermined frequency at an integrator output, wherein the predetermined frequency is determined from at least one capacitance value associated with the charge pump and a resistance value associated with the first resistance; and
    a comparator having a comparator input connected to the integrator output, the comparator adapted to generate the oscillator output signal having the predetermined frequency at a comparator output in response to the integrator output signal.

2. The relaxation oscillator of claim 1, further comprising:
    charge pump logic having a charge pump logic input connected to the comparator output, the charge pump logic adapted to receive the oscillator output signal and generate the at least one charge pump control signal.

3. The relaxation oscillator of claim 2, wherein the charge pump logic comprises a flip-flop.

4. The relaxation oscillator of claim 1, wherein the first charge pump capacitor and the second charge pump capacitor are each alternately charged by the first voltage level and discharged into the current summing node.

5. The relaxation oscillator of claim 1, wherein the interleaved charge pump further comprises:
    a first current generator connected between the first voltage level and the first charge pump capacitor; and
    a second current generator connected between the first voltage level and the second charge pump capacitor.

6. The relaxation oscillator of claim 1, wherein the predetermined frequency is determined according to the equation:

$$F_{OUT} = \frac{1}{R1 * CPx}$$

wherein $F_{out}$ is the value of the predetermined frequency, R1 is the resistance value associated with the first resistance, and CPx is a capacitance value associated with one of the first charge pump capacitor and the second charge pump capacitor.

7. The relaxation oscillator of claim 1, wherein the integrator comprises an integration capacitor and an amplifier.

8. The relaxation oscillator of claim 7, wherein the amplifier comprises a first transistor.

9. The relaxation oscillator of claim 8, wherein the voltage to current convertor comprises a second transistor.

10. The relaxation oscillator of claim 9, wherein the voltage to current convertor further comprises a current mirror.

11. A relaxation oscillator for generating an oscillator output signal having a predetermined frequency, the relaxation oscillator comprising:
a first resistance having a first resistance input adapted to receive a first voltage level and a first resistance output for producing a second voltage level;
a voltage to current convertor having a voltage to current convertor input connected to the first resistance output, the voltage to current convertor adapted to generate a first current in proportion to the second voltage level, and output the first current to a current summing node;
a charge pump having an input connected to the first voltage level received at the first resistance and an output connected to the current summing node, the charge pump adapted to provide a restoring charge to the current summing node in response to at least one charge pump control signal;
an integrator having an integrator input connected to the current summing node, the integrator adapted to produce an integrator output signal having the predetermined frequency at an integrator output, wherein the predetermined frequency is determined from at least one capacitance value associated with the charge pump and a resistance value associated with the first resistance,
wherein the integrator comprises an integration capacitor and an amplifier, wherein the amplifier comprises a first transistor, wherein the voltage to current convertor comprises a second transistor and a current mirror, and wherein the current mirror comprises a third transistor as a low side current mirror and a fourth transistor as a high side current mirror; and
a comparator having a comparator input connected to the integrator output, the comparator adapted to generate the oscillator output signal having the predetermined frequency at a comparator output in response to the integrator output signal.

12. The relaxation oscillator of claim 11, wherein the ratio of the emitter area of the first transistor to the emitter area of the second transistor is equal to two.

13. The relaxation oscillator of claim 1, wherein the interleaved charge pump further comprises:
a first MOS transistor connected between the first voltage level and a collector of the third transistor Q2, and;
a second MOS transistor MP2 connected between the first voltage level and a collector of the first transistor.

14. The relaxation oscillator of claim 13, wherein the ratio of the drain area of the first MOS transistor to the drain area of the second MOS transistor is equal to three.

15. The relaxation oscillator of claim 1, wherein the first voltage level is a supply voltage level.

16. The relaxation oscillator of claim 1, wherein the second voltage level is a virtual ground voltage level.

17. The relaxation oscillator of claim 1, wherein the relaxation oscillator is used in a universal asynchronous receiver-transmitter (UART).

18. The relaxation oscillator of claim 1, wherein the relaxation oscillator is used in a circuit having an integrated time-base.

19. The relaxation oscillator of claim 1, wherein the relaxation oscillator is used in a trimmed time-base circuit.

20. The relaxation oscillator of claim 1, wherein the relaxation oscillator is used in an analog to digital convertor.

21. The relaxation oscillator of claim 1, wherein the relaxation oscillator is used in a battery pack fuel gauge.

22. An oscillator for generating an oscillator output signal having a predetermined frequency, the oscillator comprising:
a voltage to current converter having a converter input connected to a supply voltage and a converter output connected to a summing node, the voltage to current converter adapted to generate a current from the supply voltage and output the current to the summing node;
an integrator having an integrator input connected to the summing node, the integrator adapted to receive the current from the summing node and produce an integrator output signal at an integrator output;
a comparator having a comparator input connected to the integrator output, the comparator adapted to provide a comparator output signal and an oscillator output signal having a predetermined frequency in response to the integrator output signal; and
a charge pump having a control input for receiving a control signal indicative of when the comparator output signal indicates that the integrator output signal has crossed a voltage threshold, a voltage input for receiving a voltage proportional to the supply voltage, and an charge pump output connected to the summing node, the charge pump adapted to provide a charge pump current to the summing node in response to the control signal,
wherein the charge pump comprises an interleaved charge pump comprising a first charge pump capacitor and a second charge pump capacitor, each of the first charge pump capacitor and the second charge pump capacitor adapted to be selectively charged by the voltage proportional to the supply voltage and discharged into the summing node in response to the control signal,
the integrator and the comparator comprising a feedback control loop such that the current entering the summing node from the voltage to current converter is substantially equal to and opposite in polarity to the current entering the summing node from the charge pump.

23. The oscillator of claim 22, wherein the predetermined frequency of the oscillator output signal is determined from at least one capacitance associated with the charge pump and a resistance value of a resistance associated with the voltage to frequency converter.

24. The oscillator of claim 22 further comprising:
charge pump, logic adapted to receive the comparator output signal and produce the control signal.

25. The oscillator of claim 24, wherein the charge pump logic comprises a flip-flop.

26. The oscillator of claim 22, wherein the first charge pump capacitor and the second charge pump capacitor are each alternately charged by the voltage proportional to the supply voltage and discharged into the summing node.

27. The oscillator of claim 22, wherein the predetermined frequency is determined according to the equation:

$$F_{OUT} = \frac{1}{R1 * CPx}$$

wherein $F_{out}$ is the value of the predetermined frequency, R1 is a resistance value of a resistance associated with the voltage to frequency converter, and CPx is a capacitance value associated with one of the first charge pump capacitor and the second charge pump capacitor.

28. The oscillator of claim 22, wherein the integrator comprises an integration capacitor and an amplifier.

29. The oscillator of claim 28, wherein the amplifier comprises at least one NPN transistor.

30. The oscillator of claim 28, wherein the amplifier comprises at least one MOS transistor.

31. The oscillator of claim 22, wherein the voltage to current convertor further comprises a current mirror.

32. The oscillator of claim 31, wherein the current mirror comprises a MOS transistor current mirror.

33. The oscillator of claim 31, wherein the current mirror comprises a PMOS transistor current mirror.

34. The oscillator of claim 31, wherein the current mirror comprises an NPN transistor current mirror.

35. The oscillator of claim 22, wherein the voltage to current converter comprises at least one NPN transistor.

36. The oscillator of claim 22, wherein the voltage to current converter comprises at least one MOS transistor.

37. An oscillator for generating an oscillator output signal having a predetermined frequency, the oscillator comprising:
- a voltage to current converter having a converter input connected to a supply voltage and a converter output connected to a summing node, the voltage to current converter adapted to generate a current from the supply voltage and output the current to the summing node, wherein the voltage to current converter comprises a MOS chopping circuit;
- an integrator having an integrator input connected to the summing node, the integrator adapted to receive the current from the summing node and produce an integrator output signal at an integrator output;
- a comparator having a comparator input connected to the integrator output, the comparator adapted to provide a comparator output signal and an oscillator output signal having a predetermined frequency in response to the integrator output signal; and
- a charge pump having a control input for receiving a control signal indicative of when the comparator output signal indicates that the integrator output signal has crossed a voltage threshold, a voltage input for receiving a voltage proportional to the supply voltage, and an charge pump output connected to the summing node, the charge pump adapted to provide a charge pump current to the summing node in response to the control signal,
- the integrator and the comparator comprising a feedback control loop such that the current entering the summing node from the voltage to current converter is substantially equal to and opposite in polarity to the current entering the summing node from the charge pump.

38. The oscillator of claim 22, wherein the comparator comprises at least one at least one NPN transistor.

39. The oscillator of claim 22, wherein the comparator comprises at least one at least one MOS transistor.

40. The oscillator of claim 22, wherein the oscillator is used in a universal asynchronous receiver-transmitter (UART).

41. The oscillator of claim 22, wherein the oscillator is used in a circuit having an integrated time-base.

42. The oscillator of claim 22, wherein the oscillator is used in a trimmed time-base circuit.

43. The oscillator of claim 22, wherein the oscillator is used in an analog to digital convertor.

44. The oscillator of claim 22, wherein the oscillator is used is used in a battery pack fuel gauge.

* * * * *

UNITED STATES PATENT AND TRADEMARK OFFICE
CERTIFICATE OF CORRECTION

PATENT NO. : 7,109,804 B2  Page 1 of 1
APPLICATION NO. : 10/834326
DATED : September 19, 2006
INVENTOR(S) : Urs H. Mader et al.

It is certified that error appears in the above-identified patent and that said Letters Patent is hereby corrected as shown below:

Column 3, line 31         Replace "C,"
                          With --$C_1$--

Column 3, line 67         Replace "11."
                          With --$I1$.--

Column 3, line 67         Replace "12."
                          With --$I2$--

Column 4, line 34         Replace "current 103"
                          With --current $Io_3$--

Column 4, line 48         Replace "current 103"
                          With --current $Io_3$--

Column 11, line 23        Replace "$V_s$,"
                          With --$V_5$,--

Column 16, line 47,       Replace "charge pump, logic"
Claim 24                  With --charge pump logic--

Signed and Sealed this

Twenty-sixth Day of December, 2006

JON W. DUDAS
*Director of the United States Patent and Trademark Office*